United States Patent
Yoon et al.

(10) Patent No.: US 8,004,336 B2
(45) Date of Patent: Aug. 23, 2011

(54) SEMICONDUCTOR MEMORY DEVICE AND METHOD FOR OPERATING THE SAME

(75) Inventors: Dae-Kun Yoon, Kyoungki-do (KR);
Dae-Han Kwon, Kyoungki-do (KR);
Taek-Sang Song, Kyoungki-do (KR)

(73) Assignee: Hynix Semiconductor Inc. (KR)

( * ) Notice: Subject to any disclaimer, the term of this patent is extended or adjusted under 35 U.S.C. 154(b) by 562 days.

(21) Appl. No.: 12/150,912

(22) Filed: May 1, 2008

(65) Prior Publication Data
US 2009/0168552 A1 Jul. 2, 2009

(30) Foreign Application Priority Data

Dec. 26, 2007 (KR) .................. 10-2007-0137430

(51) Int. Cl.
*H03H 11/16* (2006.01)
*H03K 5/13* (2006.01)
(52) U.S. Cl. ............. 327/233; 327/3; 327/33; 327/254; 327/255; 365/189.07; 365/233.01
(58) Field of Classification Search ................ 327/3, 33, 327/233, 254, 255; 365/189.07, 233.01
See application file for complete search history.

(56) References Cited

U.S. PATENT DOCUMENTS

| | | | | |
|---|---|---|---|---|
| 7,449,930 | B2* | 11/2008 | Hur ................. | 327/158 |
| 7,701,267 | B2* | 4/2010 | Yoon et al. ........... | 327/147 |
| 7,791,391 | B2* | 9/2010 | Yoon et al. ........... | 327/254 |
| 7,825,712 | B2* | 11/2010 | Yoon ................ | 327/237 |
| 2005/0053180 | A1* | 3/2005 | Nose et al. ........... | 375/354 |

FOREIGN PATENT DOCUMENTS

| | | |
|---|---|---|
| JP | 2002-042469 | 2/2002 |
| KR | 10-2000-0043233 A | 7/2000 |
| KR | 10-0486256 B1 | 4/2005 |
| KR | 10-2005-0041196 A | 5/2005 |
| KR | 10-2007-0079315 A | 8/2007 |

* cited by examiner

*Primary Examiner* — Lincoln Donovan
*Assistant Examiner* — John W Poos
(74) *Attorney, Agent, or Firm* — Blakely, Sokoloff, Taylor & Zafman

(57) ABSTRACT

A semiconductor memory device includes an edge detector configured to receive two pairs of complementary clocks to detect edges of the clocks, a comparator configured to compare output signals of the edge detector to detect whether clocks of the same pair have a phase difference of 180 degrees and detect whether clocks of different pairs have a phase difference of 90 degrees, a control signal generator configured to generate a control signal for controlling phases of the clocks according to an output signal of the comparator, and a phase corrector configured to correct phases of the clocks in response to the control signal.

17 Claims, 3 Drawing Sheets

SEMICONDUCTOR MEMORY DEVICE AND METHOD FOR OPERATING THE SAME

CROSS-REFERENCE(S) TO RELATED APPLICATIONS

The present invention claims priority of Korean patent application number 10-2007-0137430, filed on Dec. 26, 2007, which is incorporated by reference in its entirety.

BACKGROUND OF THE INVENTION

The present invention relates to a semiconductor memory device, and more particularly to a phase correction circuit for correcting a phase of a clock signal of a semiconductor memory device to enhance operation reliability, and a phase correction method thereof.

In a system with a variety of semiconductor devices, a semiconductor memory device serves as a data storage. The semiconductor memory device outputs data corresponding to addresses received from a data processor, e.g., a central processing unit (CPU), or stores data received from the data processor into memory cells selected by addresses.

As the operating speed of the system increases and semiconductor integrated circuit technologies are advanced, semiconductor memory devices are required to input and output data at higher speed. To meet this requirement, a synchronous memory device was developed. The synchronous memory device is designed to input and output data in synchronization with a received system clock. However, since even the synchronous memory device could not meet the required data input/output speed, a double data rate (DDR) synchronous memory device was developed. The DDR synchronous memory device is designed to input or output data at falling edges and rising edges of the system clock.

The DDR synchronous memory device must process two data during one cycle of the system clock so as to input or output data at a falling edge and a rising edge of the system clock. In other words, the DDR synchronous memory device must output data or input/store data at the rising edge and the falling edge of the system clock. Specifically, the DDR memory device must output data exactly in synchronization with the rising edge or the falling edge of the clock.

To increase operating speed of the semiconductor memory device, a quad data rate (QDR) semiconductor memory device has been suggested. The QDR semiconductor memory device is designed to transfer four data during one cycle of the system clock. Seeing that the typical DDR semiconductor memory device can transfer two data during one cycle of the system clock, the QDR memory device can transfer up to two times more data than the typical semiconductor memory device in theory. The QDR memory device is different from the typical semiconductor memory device in that the QDR memory device uses two clocks, instead of using a single clock. One clock is used as a reference for transferring data, and the other clock is used as a reference for transferring addresses and commands for reading/writing the data, thereby increasing the speed of reading/writing data. The QDR memory device can be widely applied to high-speed telecommunication and network apparatuses where the speed of transferring data is more important than other factors such as power consumption, cost, and the like, and a graphic processing apparatus needing to read and write a large amount of data in a short time.

When a system clock is applied to such a semiconductor memory device, a clock input buffer and a transfer line for transferring the system clock may cause the system clock to be delayed and a phase of the system clock to be changed. To resolve this, the semiconductor memory device generally includes a phase correction circuit for correcting a phase of the system clock. The phase correction circuit may also be used to correct a phase of a reference clock for transferring data to the semiconductor memory device or to the outside. Specifically, the high-speed semiconductor memory device inputs/outputs data or addresses at both the rising edges and the falling edges of the reference clock. Therefore, a change in the phase of the reference clock may cause an insufficient margin to the overall operations of the semiconductor memory device, and thus failure or delay of operations.

The phase correction circuit detects a phase of a clock and then delays the clock by a delay time to correct the detected phase of the clock. If there is an error while detecting the phase, the error may decrease the accuracy of the correction operation of the phase correction circuit. Such an error may be increased as the semiconductor memory device is highly integrated and the operating speed of the semiconductor memory device is raised. Especially, as a line width of the circuit in the semiconductor memory device becomes finer, the error may be increased further. In addition, as a duty cycle of a clock received from the outside is decreased, an error ratio, i.e., the ratio of the error to the duty cycle of the clock, may be increased. The increase of the error ratio means that an operation margin of a read/write operation is decreased, or that an accurate operation cannot be performed in a predetermined duration. Therefore, operation reliability of the semiconductor memory device is decreased.

As described above, to allow the newly proposed QDR memory device to input/output four data during one cycle of the system clock, the data should be synchronized with phases of 0 degree, 90 degrees, 180 degrees, and 270 degrees of the system clock. In other words, the QDR memory device should output one data for each 90 degrees. As the data are synchronized exactly with the phases of the system clock, each data can have a maximum valid window for the operation of the semiconductor memory device, thereby enhancing the operation reliability of the semiconductor memory device. Therefore, whereas the typical semiconductor memory device has a phase correction circuit for maintaining a phase distance of 180 degrees between a rising edge and a falling edge, the QDR memory device needs a phase correction circuit for correcting a phase of an internal clock so that data is transferred exactly at the phases of 0 degree, 90 degrees, 180 degrees, and 270 degrees of the system clock.

SUMMARY OF THE INVENTION

Embodiments of the present invention are directed to providing a phase correction circuit of a semiconductor memory device and a system, the phase correction circuit using a quadrature phase clock to detect and correct phases of internal clocks corresponding to the quadrature phases (0 degree, 90 degrees, 180 degrees, and 270 degrees) of a system clock.

In accordance with an aspect of the present invention, there is provided a semiconductor memory device, which includes an edge detector configured to receive two pairs of complementary clocks to detect edges of the clocks, a comparator configured to compare output signals of the edge detector to detect whether clocks of the same pair have a phase difference of 180 degrees and detect whether clocks of different pairs have a phase difference of 90 degrees, a control signal generator configured to generate a control signal for controlling phases of the clocks according to an output signal of the comparator, and a phase corrector configured to correct phases of the clocks in response to the control signal.

In accordance with another aspect of the present invention, there is provided a phase correction circuit, which includes a first detector configured to detect whether a first clock and a second clock have a phase difference of 180 degrees, a second detector configured to detect whether a third clock and a fourth clock have a phase difference of 180 degrees, a phase detector configured to detect whether the first and third clocks or the second and fourth clocks have a phase difference of 90 degrees, a code counter configured to generate a plurality of digital codes corresponding to output signals of the first detector, the second detector and the phase detector, and a phase corrector configured to correct the first to fourth clocks in response to the plurality of digital codes to generate quadrature phase clocks.

In accordance with a further aspect of the present invention, there is provided a phase correction method, which includes detecting a phase difference between a first clock and a second clock to correct the first and second clocks to have a phase difference of 180 degrees, detecting a phase difference between a third clock and a fourth clock to correct the third and fourth clocks to have a phase difference of 180 degrees, and detecting a phase difference between the first clock and the third clock to correct the first and third clocks to have a phase difference of 90 degrees to generate quadrature phase signals.

In accordance with a further aspect of the present invention, there is provided a clock phase correction method, which includes correcting N pairs of clocks (where, N is a natural number larger than 1) for one clock of each pair to have a phase difference of 180 degrees with the other clock of the pair, and selecting one clock in each pair and correcting the selected clocks to have phase differences of 360/N degrees with each other to control all of the clocks to be separated from each other by uniform phase differences of 360/N degrees.

In accordance with an aspect of the present invention, there is provided a phase correction circuit of a semiconductor memory device and a system using a quadrature phase clock to input or output two data in each logic high section and two data in each logic low section of a system clock. The phase correction circuit corrects phases of internal clocks such that the internal clocks corresponding to the phases of 0 degree and 180 degrees and the internal clocks corresponding to the phases of 90 degrees and 270 degrees respectively have phase differences of 180 degrees with each other. Thereafter, the phase correction circuit corrects phases of the corrected internal clocks such that the corrected internal clocks corresponding to the phases of 0 degree and 90 degrees and the corrected internal clocks corresponding to the phases of 180 degrees and 270 degrees respectively have phase differences of 90 degrees. Further, for the correction, the phase correction circuit lifts the phase of the internal clock through a sequential step-by-step process to remove error in the correction process and shorten the correction time.

DESCRIPTION OF SPECIFIC EMBODIMENTS

Hereinafter, a phase correction circuit and a phase correction method thereof in accordance with the present invention will be described in detail with reference to the accompanying drawings.

Figure 1:
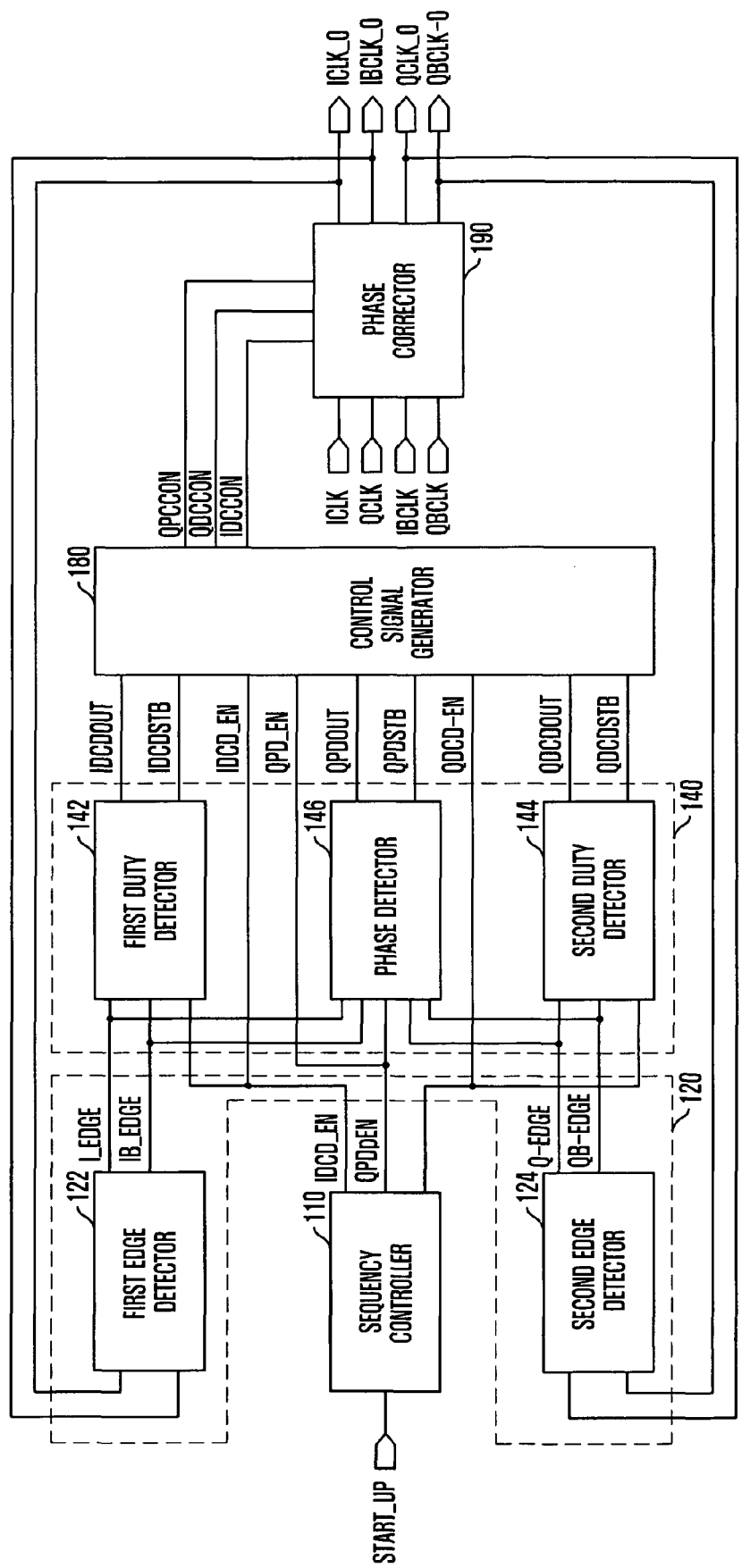
FIG. 1 is a block diagram of a phase correction circuit in accordance with an embodiment of the present invention.

FIG. 1 is a block diagram of a phase correction circuit in accordance with an embodiment of the present invention.

Referring to FIG. 1, the phase correction circuit of the semiconductor memory device includes an edge detector 120, a comparator 140, a control signal generator 180, and a phase corrector 190. The edge detector 120 receives a pair of complementary clocks ICLK_O and IBCLK_O and a pair of complementary clocks QCLK_O and QBCLK_O to detect edges having the same logic level transition. The comparator 140 compares the detected edges corresponding to the same pair of clocks, i.e., the clocks ICLK_O and IBCLK_O or the clocks QCLK_O and QBCLK_O, to determine whether the clocks of the same pair have a phase difference of 180 degrees. The comparator 140 also compares the detected edges corresponding to different pairs of clocks, i.e., clocks ICLK_O and QCLK_O or clocks IBCLK_O and QBCLK_O, to determine whether the clocks of different pairs have a phase difference of 90 degrees. The control signal generator 180 outputs control signals IDCCON, QDCCON and QPCCON for phase correction according to output signals of the comparator 140. The phase corrector 190 corrects the phases of a pair of complementary clocks ICLK, IBCLK and a pair of complementary clocks QCLK and QBCLK according to the control signals IDCCON, QDCCON and QPCCON, thereby outputting the four clocks ICLK_O, IBCLK_O, QCLK_O and QBCLK_O. The four clocks ICLK, IBCLK, QCLK and QBCLK are input to the phase corrector 190 as initial values and then the four clocks ICLK_O, IBCLK_O, QCLK_O and QBCLK_O are fed back for the correction (not shown).

The edge detector 120 includes a first edge detector 122 and a second edge detector 124. The first edge detector 122 detects rising edges of a first clock ICLK_O and a second clock IBCLK_O. The second edge detector 124 detects rising edges of a third clock QCLK_O and a fourth clock QBCLK_O.

The comparator 140 includes a first duty detector 142, a second duty detector 144, and a phase detector 146. The first duty detector 142 compares a duty ratio difference between output signals I_EDGE and IB_EDGE of the first edge detector 122. The second duty detector 144 compares a duty ratio difference between output signals Q_EDGE and QB_EDGE of the second edge detector 122. The phase detector 146 compares an output signal of the first edge detector 122 with an output signal of the second edge detector 124 to determine whether the different pair of clocks have a phase difference of 90 degrees therebetween.

As circuit configuration in accordance with embodiments of the present invention, the control signal generator 180 may output the control signals having analog values or digital value. In the case when the control signals IDCCON, QDCCON and QPCCON generated in response to output signals of the comparator 140 are analogue signals having voltage levels, the phase corrector 190 includes a voltage-controlled delay line (VCDL) capable of changing delay times according to the analogue control signals. On the contrary, in the case when the control signals IDCCON, QDCCON and QPCCON are digital signals, the phase corrector 190 includes a plurality of shift registers capable of changing delay times according to the digital control signals.

The phase correction circuit of the semiconductor memory device further includes a sequence controller 110 for controlling the comparator 140 and the control signal generator 180. The sequence controller 110 operates the first and second duty detectors 142 and 144 and a phase detector 146 of the comparator 140 step-by-step such that a phase difference between clocks of different pair is corrected to 90 degrees after a phase difference between clocks of the same pair is corrected to 180 degrees.

Figure 2:
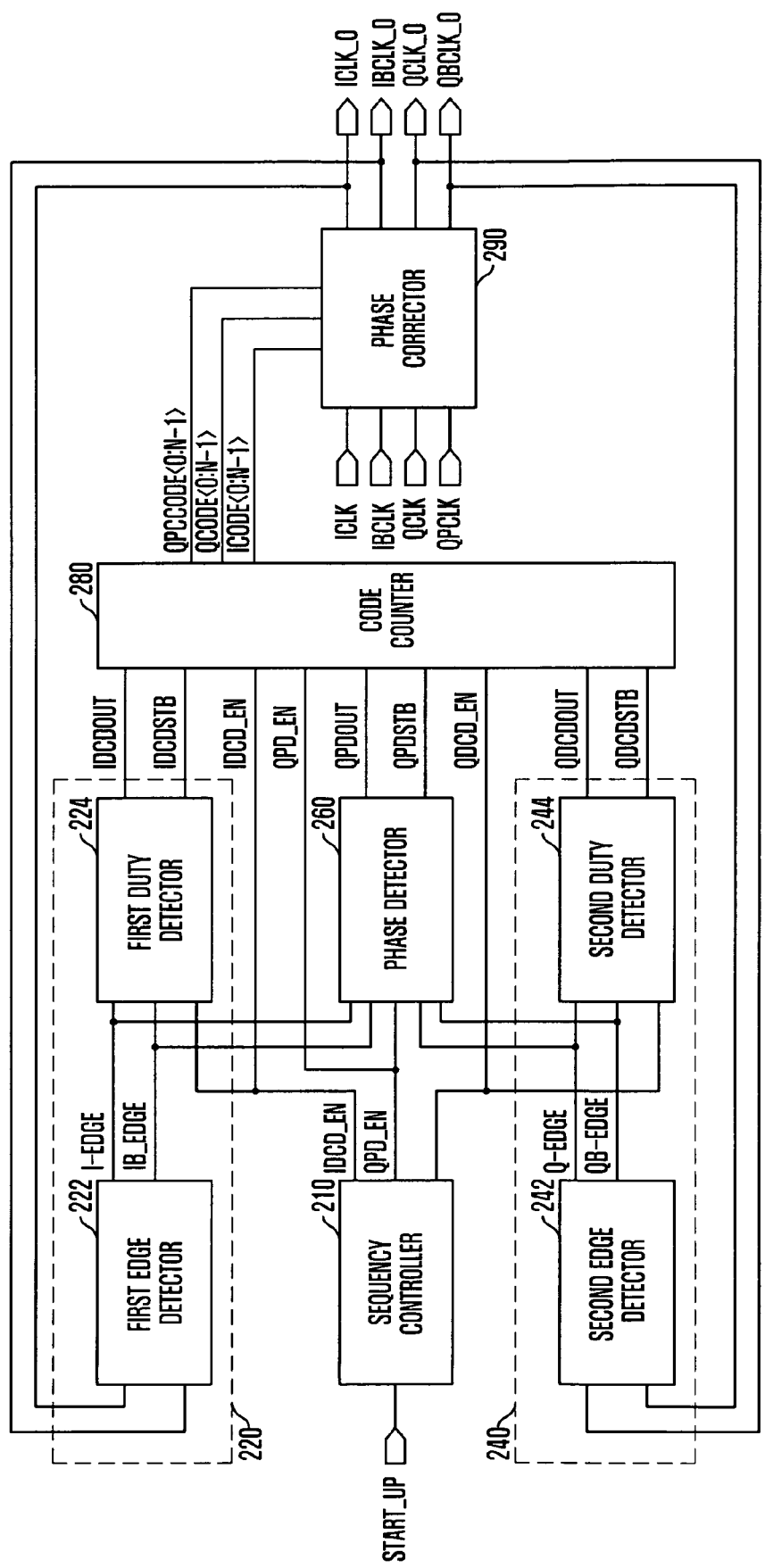
FIG. 2 is a block diagram of a phase correction circuit in accordance with another embodiment of the present invention.

FIG. 2 is a block diagram of a phase correction circuit in accordance with another embodiment of the present invention.

Referring to FIG. 2, the phase correction circuit includes a first detector 220, a second detector 240, a phase detector 260, a code counter 280, and a phase corrector 290. The first detector 220 detects a phase difference between a first clock ICLK_O and a second clock IBCLK_O. The second detector 240 detects a phase difference between a third clock QCLK_O and a fourth clock QBCLK_O. The phase detector 260 detects whether a phase difference between the first and third clocks ICLK_O and QCLK_O or the second and fourth clocks IBCLK_O and QBCLK_O is 90 degrees. The code counter 280 outputs a plurality of digital codes ICODE<0:N−1>, QCODE<0:N−1> and QPCCODE<0:N−1> corresponding to output signals of the first and second detectors 220 and 240 and the phase detector 260. The phase corrector 290 corrects phases of first to fourth input clocks in response to the plurality of digital codes ICODE<0:N−1>, QCODE<0:N−1> and QPCODE<0:N−1> to generate quadrature phase clocks, i.e., the first to fourth clocks ICLK_O, IBCLK_O, QCLK_O and QBCLK_O. As described in reference to FIG. 1, clocks ICLK, QCLK, IBCLK and QBCLK are input to the phase corrector 190 as initial values and then the first to fourth clocks ICLK_O, IBCLK_O, QCLK_O and QBCLK_O are fed back for the correction (not shown). In the result, the first to fourth clocks ICLK_O, QCLK_O, IBCLK_O and QBCLK_O are separated by phase differences of 90 degrees therebetween, and are mainly used in a semiconductor memory device (quad data rate memory device: QDR), telecommunication and network system that can transfer four data during one cycle of the system clock.

The first detector 220 includes a first edge detector 222 for detecting a rising edge of the first clock ICLK_O and a rising edge of the second clock IBCLK_O, and a first duty detector 224 for detecting a duty ratio difference between the output signals of the first edge detector 222. Similarly, the second detector 240 includes a second edge detector 242 for detecting a rising edge of the third clock QCLK_O and a rising edge of the fourth clock QBCLK_O, and a second duty detector 244 for detecting a duty ratio difference between the output signals of the second edge detector 222.

The first edge detector 222 in the first detector 220 activates a first edge detection signal I_EDGE and deactivates a second edge detection signal IB_EDGE in response to the rising edge of the first clock ICLK_O. Also, the first edge detector 222 deactivates the first edge detection signal I_EDGE and activates the second edge detection signal IB_EDGE in response to the rising edge of the second clock IBCLK_O. The first duty detector 224 compares durations of logic high level sections of the first edge detection signal I_EDGE and the second edge detection signal IB_EDGE. When the duration of the logic high level section of the first edge detection signal I_EDGE is longer than the duration of the logic high level section of the second edge detection signal IB_EDGE, the first duty detector 224 activates a first comparison signal IDCDOUT. On the contrary, when the duration of the logic high level section of the second edge detection signal IB_EDGE is longer than the duration of the logic high level section of the first edge detection signal I_EDGE, the first duty detector 224 activates a second comparison signal IDCDSTB.

Then, the code counter 280 outputs a first delay control code ICODE<0:N−1> to the phase corrector 290 in response to the first and second comparison signals IDCDOUT and IDCDSTB received from the first duty detector 224. To this end, the code counter 280 is provided with an N-bit counter (where, N is a natural number) to increase or decrease a value of the first delay control code ICODE<0:N−1> according to the first and second comparison signals IDCDOUT and IDCDSTB.

The phase corrector 290 delays phases of the first and second input clocks ICLK and IBCLK by a phase delay time corresponding to the first delay control code ICODE<0:N−1> and outputs first and second corrected clocks, i.e., the first and second clocks ICLK_O and IBCLK_O, having a phase difference of 180 degrees therebetween. Here, the phase corrector 290 includes a signal transfer line with a plurality of delays for changing phases of the input clocks ICLK, QCLK, IBCLK and QBCLK. The phase corrector 290 controls the number of the delays through which the first and second clocks pass, according to the first delay control code ICODE<0:N−1> of N bits output from the code counter 280.

The second edge detector 242 in the second detector 240 activates a third edge detection signal Q_EDGE and deactivates a fourth edge detection signal QB_EDGE in response to the rising edge of the third clock QCLK_O. Also, the second edge detector 242 deactivates the third edge detection signal Q_EDGE and activates the fourth edge detection signal QB_EDGE in response to the rising edge of the fourth clock QBCLK_O. The second duty detector 244 compares durations of logic high level sections of the third edge detection signal Q_EDGE and the fourth edge detection signal QB_EDGE. When the duration of the logic high level section of the third edge detection signal I_EDGE is longer than the duration of the logic high level section of the fourth edge detection signal IB_EDGE, the second duty detector 244 activates a third comparison signal QDCDOUT. On the contrary, when the duration of the logic high level section of the fourth edge detection signal IB_EDGE is longer than the duration of the logic high level section of the third edge detection signal I_EDGE, the second duty detector 244 activates a fourth comparison signal QDCDSTB.

Then, the code counter 280 outputs a second delay control code QCODE<0:N−1> to the phase corrector 290 in response to the third and fourth comparison signals QDCDOUT and QDCDSTB. To this end, the code counter 280 is provided with an N-bit counter (where, N is a natural number) to increase or decrease a value of the second delay control code QCODE<0:N−1> according to the third and fourth comparison signals QDCDOUT and QDCDSTB.

The phase corrector 290 delays phases of third and fourth input clocks QCLK and QBCLK by a phase delay time corresponding to the second delay control code QCODE<0:N−1> and outputs third and fourth corrected clocks, i.e., the third and fourth clocks QCLK_O and QBCLK_O, having a phase difference of 180 degrees therebetween.

As described above, the phase correction circuit corrects the phases of the four input clocks ICLK, IBCLK, QCLK, and QBCLK such that the first and second clocks ICLK_O and IBCLK_O have a phase difference of 180 degrees, and the third and fourth clocks QCLK_O and QBCLK_O have a phase difference of 180 degrees. To this end, in the case of the first and second input clocks ICLK and IBCLK, the phase correction circuit performs a phase delay operation and the delay time is determined according to the comparison result between the phases of the first and second clocks ICLK_O and IBCLK_O. The operation result is fed back to repeat the operation until the phase difference between the first and second clocks ICLK_O and IBCLK_O becomes exactly 180 degrees. If both of the first and second comparison signals IDCDOUT and IDCDSTB are deactivated, it is determined that the phase difference between the first and second clocks ICLK_O and IBCLK_O is exactly 180 degrees. Then, the value of the delay control code ICODE<0:N−1> is not changed any more. Phase comparison and delay operations are also performed on the third and fourth input clocks QCLK and QBCLK in a similar way as described above until the phase difference between the third and fourth clocks QCLK_O and QBCLK_O becomes exactly 180 degrees.

After correcting the clocks ICLK_O, IBCLK_O and the clocks QCLK_O and QBCLK_O to have phase differences of exactly 180 degrees, respectively, the phase detector 260 receives the output signals of the first edge detector 222 and the second edge detector 242 to determine whether the clocks ICLK_O and QCLK_O or the clocks IBCLK_O and QBCLK_O have a phase difference of 90 degrees. In more detail, the phase detector 260 mixes the first edge detection signal I_EDGE received from the first edge detector 222 and the third edge detection signal Q_EDGE received from the second edge detector 242. The phase detector 260 also mixes the second edge detection signal IB_EDGE received from the first edge detector 222 and the fourth edge detection signal QB_EDGE received from the second edge detector 242. Then, the phase detector 260 determines whether the phase difference between the clocks ICLK_O and QCLK_O or the clocks IBCLK_O and QBCLK_O is 90 degrees by detecting whether the two mixed signals have a phase difference of 180 degrees with each other. The output signals QPDOUT and QPDSTB of the phase detector 260 are similar to the output signals of the first duty detector 224 and the second duty detector 244. The code counter 280 increases or decreases the value of a third delay control code QPCCODE<0:N−1> according to the output signals QPDOUT and QPDSTB of the phase detector 260. The phase corrector 290 controls phase delay times for the first and third input clocks ICLK and QCLK to output the first and third corrected clocks, i.e., the first and third clocks ICLK_O and QCLK_O, having a phase difference of 90 degrees therebetween.

As described above, the phase corrector 290 includes a plurality of delays for delaying the first to fourth input clocks ICLK, QCLK, IBCLK and QBCLK to output the first to fourth corrected clocks ICLK_O, QCLK_O, IBCLK_O and QBCLK_O as quadrature phase clocks. The phase delay times of the first to fourth input clocks ICLK, QCLK, IBCLK and QBCLK are determined according to the first and third delay control codes ICODE<0:N−1>, QCODE<0:N−1> and QPCCODE<0:N−1>.

The phase correction circuit further includes a sequence controller 210. The sequence controller 210 generates a first enable signal IDCD_EN for enabling the first duty detector 224, a second enable signal QDCD_EN for enabling the second duty detector 244, and a third enable signal QPD_EN for enabling the phase detector 260. Here, the sequence controller 210 outputs the first to third enable signals IDCD_EN, QDCD_EN and QPD_EN to the code counter 280 to control each of the N-bit counters in the code counter 280. Here, the third enable signal QPD_EN is activated after the first enable signal IDCD_EN and the second enable signal QDCD_EN are deactivated.

The code counter 280 includes a plurality of N-bit counters, each of which converts the output signal of the first duty detector 224 to the first delay control code ICOD<0:N−1> when the first enable signal IDCD_EN is activated, converts the output signal of the second duty detector 244 to the second delay control code QCODE<0:N−1> when the second enable signal QDCD_EN is activated, and converts the output signal of the phase detector 260 to the third delay control code QPCCODE<0:N−1> when the third enable signal QPD_EN is activated. Therefore, the phase correction circuit in accordance with this embodiment can perform the operations for generating quadrature phase clocks sequentially and selectively, to prevent a malfunction and reduce current consumption.

The first to third enable signals IDCD_EN, QDCD_EN and QPD_EN may be designed to be activated for predetermined durations after the receipt of the driving signal START_UP. Though not shown, the first to third enable signals IDCD_EN, QDCD_EN and QPD_EN may be designed to be activated or deactivated in response to the output signals of the first duty detector 224, the second duty detector 244, and the phase detector 260.

Since operations of the circuit are sufficiently described above and circuits for performing the operations can be easily implemented with a variety of designs by those skilled in the art, a detailed description thereof will be omitted. The phase correction circuit in accordance with embodiments of the present invention can be applied to any system or electronic apparatus that uses four quadrature phase clocks I, Q, /I and /Q having different phases. The phase correction circuit performs the following operations to make the phase differences of the quadrature phase clocks uniform. First, the phase correction circuit corrects phases of the clocks of the same pairs (i.e., clocks I and /I, and clocks Q and /Q) to have phase relation corresponding 0 degree and 180 degrees or phase relation corresponding 90 degrees and 270 degrees, respectively. Next, the phase correction circuit performs a quadrature phase correction on one clock of each pair of clocks to establish a phase relation of 0 degree and 90 degrees between the clocks of different pairs. Resultantly, rising edges of the four quadrature phase clocks I, Q, /I and /Q can have exact phase relations of 0 degree, 90 degrees, 180 degrees and 270 degrees.

Figure 3:
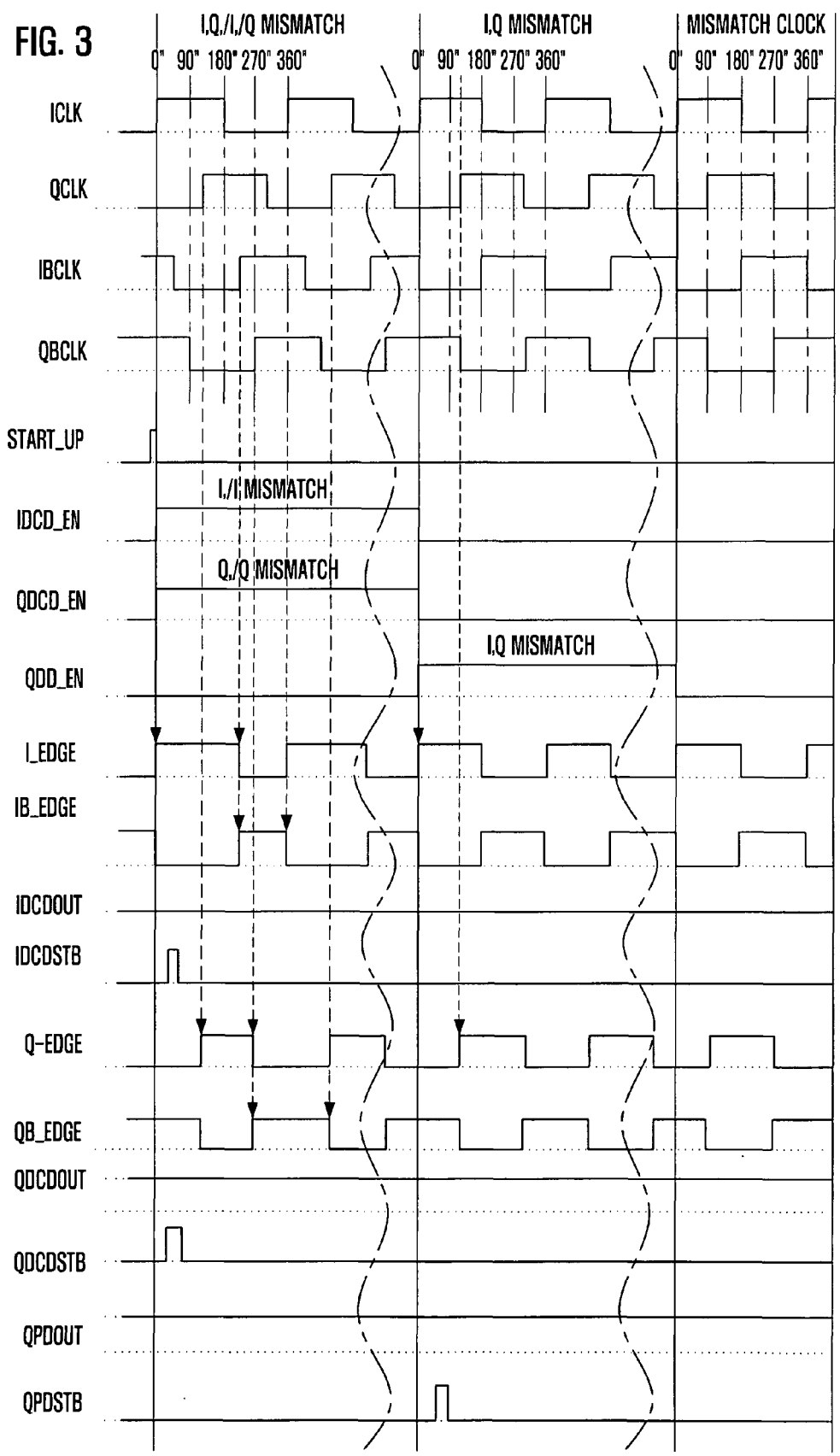
FIG. 3 is a timing diagram illustrating an operation of the phase correction circuit of FIG. 2.

FIG. 3 is a timing diagram illustrating an operation of the phase correction circuit of FIG. 2.

Referring to FIG. 3, the phase correction circuit generates quadrature phase clocks by performing two main operations. The first main operation includes correcting phases of a pair of clocks I and /I to establish a phase relation of 0 degree and 180 degrees therebetween, and correcting phases of another pair of clocks Q and /Q to establish a phase relation of 90 degrees and 270 degrees therebetween. The second main operation is performing quadrature phase corrections on the clock I of the pair of clocks I and /I and the clock Q of the pair of clocks Q and /Q to establish a phase relation of 0 degree and 90 degrees between the clock I and the clock Q. In other word, it is assumed that first to fourth clocks ICLK, QCLK, IBCLK and QBCLK have inappropriate phases in an initial state. When the first main operation is performed, the first clock ICLK and the second clock IBCLK come to have a phase difference of 180 degrees, and the third clock QCLK and the fourth clock QBCLK also come to have a phase difference of 180 degrees. However, the phase difference between the first clock ICLK and the third clock QCLK is not appropriate yet. Therefore, a second main operation is performed on the first clock ICLK and the third clock QCLK such that they have a phase difference of 90 degrees with each other. Consequently, through the above described first and second main operations, the first to fourth clocks ICLK, QCLK, IBCLK and QBCLK are corrected to quadrature phase clocks having the phases of 0 degree, 90 degrees, 180 degrees and 270 degrees, respectively.

As described above, a phase correction method in accordance with the embodiment of the present invention includes detecting a phase difference between the first clock ICLK and the second clock IBCLK to correct the clocks to have a phase difference of 180 degrees, detecting a phase difference between the third clock QCLK and the fourth clock QBCLK to correct the clocks to have a phase difference of 180 degrees, and detecting a phase difference between the first clock ICLK an the third clock QCLK to correct the clocks to have a phase difference of 90 degrees. As such, the first to fourth clocks ICLK, IBCLK, QCLK and QBCLK may be corrected to quadrature phase signals having phases of 0 degree, 90 degrees, 180 degrees and 270 degrees, respectively.

In more detail, the detecting a phase difference between the first clock ICLK and the second clock IBCLK to correct the clocks includes: detecting a rising edge of the first clock ICLK and a rising edge of the second clock IBCLK; activating the first edge detection signal I_EDGE and deactivating the second edge detection signal IB_EDGE in response to the rising edge of the first clock ICLK, and deactivating the first edge detection signal I_EDGE and activating the second edge detection signal IB_EDGE in response to the rising edge of the second clock IBCLK; comparing logic high level sections of the first edge detection signal I_EDGE and the second edge detection signal IB_EDGE to output the comparison signals IDCDOUT and IDCDSTB; generating the first delay correction codes ICODE<0:N-1>, which are digital codes corresponding to the comparison signals IDCDOUT and IDCDSTB; and delaying the phases of the first and second clocks ICLK and IBCLK in response to the first delay correction codes ICODE<0:N-1> so that the first and second clocks ICLK and IBCLK have a phase difference of 180 degrees.

Similarly, the detecting a phase difference between the third clock QCLK and the fourth clock QBCLK to correct the clocks includes: detecting a rising edge of the third clock QCLK and a rising edge of the fourth clock QBCLK; activating the third edge detection signal Q_EDGE and deactivating the fourth edge detection signal QB_EDGE in response to the rising edge of the third clock QCLK, and deactivating the third edge detection signal Q_EDGE and activating the fourth edge detection signal QB_EDGE in response to the rising edge of the fourth clock QBCLK; comparing logic high level sections of the third edge detection signal Q_EDGE and the fourth edge detection signal QB_EDGE to output the comparison signals QDCDOUT and QDCDSTB; generating the second delay correction codes QCODE<0:N-1>, which are digital codes corresponding to the comparison signals QDCDOUT and QDCDSTB; and delaying the phases of the third and fourth clocks QCLK and QBCLK in response to the second delay correction codes QCODE<0:N-1> so that the third and fourth clocks QCLK and QBCLK have a phase difference of 180 degrees with each other.

Finally, the detecting a phase difference between the first clock ICLK an the third clock QCLK to correct the clocks includes: detecting whether a phase difference between the first clock ICLK and the third clock QCLK is 90 degrees to output detection result signals QPDOUT and QPDSTB; generating the third delay correction codes QPCCODE<0:N-1>, which are digital codes corresponding to the detection result signals QPDOUT and QPDSTB; and delaying the phases of the first clock ICLK and the third clock QCLK in response to the third delay correction codes QPCCODE<0:N-1> to generate quadrature phase signals ICLK_O, QCLK_O, IBCLK_O and QBCLK_O.

Since the DDR semiconductor memory device was developed to overcome the limitation in the clock speed, attempts to improve operating speed of a data processing apparatus such as a semiconductor memory device and a CPU has been focused on inputting/outputting a plurality of data during one clock cycle. However, such a method may reduce a data valid window if the phase relations of the reference clocks for inputting/outputting data is inaccurate. In such a case, it may be impossible to achieve a desired operation performance of the data processing apparatus. Therefore, the data processing apparatus requires a circuit for correcting the phases of the reference clocks. The phase correction circuit and method in accordance with embodiments of the present invention can correct the quadrature phase clocks so that rising edges of the quadrature phase clocks are positioned exactly at 0 degree, 90 degrees, 180 degrees and 270 degrees, respectively, thereby optimizing operating speed of the semiconductor memory device and system.

Furthermore, even to the case where the phase intervals are decreased further to output more data, the present invention can be applied. A clock phase correction method in accordance with the present invention includes correcting N pairs of clocks (where, N is a natural number larger than 1) such that one clock of each pair has a phase difference of 180 degrees with the other clock of the pair, and selecting one clock in each pair to correct the selected clocks to have phase differences of 360/N degrees with each other, so that all of the clocks are separated from each other by uniform distances.

Specifically, the correcting N pairs of clocks includes: detecting rising edges of two clocks of each pair; generating two signals activating in the opposite direction in response to the detected rising edges; comparing logic high level sections of the two signals; generating digital codes corresponding to the comparison results; and delaying phases of the two clocks in response to the digital codes so that the two clocks have a phase difference of 180 degrees therebetween. The selecting one clock in each pair to correct the selected clock includes: selecting one clock in each pair to detect whether the selected clocks have phase differences of 360/N degrees therebetween; generating digital codes corresponding to the detection result; and delaying phases of the selected clocks in response to the digital codes such that the selected clocks have phase differences of 360/N degrees.

As described above, the phase correction circuit in accordance with the embodiments of the present invention can correct accurately phase differences between quadrature phase clocks in a semiconductor memory device and system using the quadrature phase clocks, thereby enhancing reliability in transferring data or signal and securing a stable operation.

Also, the phase correction circuit performs phase correction operations on the quadrature phase clocks through a sequential step-by-step process, thereby reducing the correction time and the overall current consumption.

While the present invention has been described with respect to the specific embodiments, it will be apparent to those skilled in the art that various changes and modifications may be made without departing from the spirit and scope of the invention as defined in the following claims.

What is claimed is:

1. A phase correction circuit, comprising:
   a first detector configured to detect a phase difference between a first clock and a second clock;
   a second detector configured to detect a phase difference between a third clock and a fourth clock;
   a phase detector configured to detect a phase difference between the first and third clocks;

a code counter configured to generate a plurality of digital codes corresponding to output signals of the first detector, the second detector and the phase detector; and a phase corrector configured to correct the first to fourth clocks in response to the plurality of digital codes.

2. The phase correction circuit as recited in claim 1, wherein the first detector includes:

a first edge detector configured to detect a rising edge of the first clock and a rising edge of the second clock; and a first duty detector configured to detect a duty difference between output signals of the first edge detector.

3. The phase correction circuit as recited in claim 2, wherein the first edge detector activates a first edge detection signal and deactivates a second edge detection signal in response to the rising edge of the first clock, and deactivates the first edge detection signal and activates the second edge detection signal in response to the rising edge of the second clock.

4. The phase correction circuit as recited in claim 3, wherein the first duty detector is configured to compare durations of the first and second edge detection signals respectively having the same logic level.

5. The phase correction circuit as recited in claim 1, wherein the second detector includes:

a second edge detector configured to detect a rising edge of the third clock and a rising edge of the fourth clock; and a second duty detector configured to detect a duty difference between output signals of the second edge detector.

6. The phase correction circuit as recited in claim 5, wherein the second edge detector activates a third edge detection signal and deactivates a fourth edge detection signal in response to the rising edge of the third clock, and deactivates the third edge detection signal and activates the fourth edge detection signal in response to the rising edge of the fourth clock.

7. The phase correction circuit as recited in claim 6, wherein the second duty detector is configured to compare durations of the third and fourth edge detection signals respectively having the same logic level.

8. The phase correction circuit as recited in claim 1, further comprising a phase correction controller configured to generate a first enable signal for enabling a first duty detector, a second enable signal for enabling a second duty detector, and a third enable signal for enabling the phase detector.

9. The phase correction circuit as recited in claim 8, wherein the third enable signal is activated after the first and second enable signals are deactivated.

10. The phase correction circuit as recited in claim 9, wherein the first, second and third enable signals are deactivated according to detection results of the first detector, the second detector, and the phase detector, respectively.

11. The phase correction circuit as recited in claim 9, wherein the code counter includes a plurality of counters to convert a detection result of the first duty detector to a first delay control code when the first enable signal is activated, convert a detection result of the second duty detector to a second delay control code when the second enable signal is activated, and convert a detection result of the phase detector to a third delay control code when the third enable signal is activated.

12. The phase correction circuit as recited in claim 11, wherein the phase corrector includes a plurality of delays to delay the first to fourth clocks to output the quadrature phase clocks, and determines delay times of the first to fourth clocks according to the first to third delay control codes.

13. A phase correction method, comprising:

detecting a phase difference between a first clock and a second clock to output a first detect result;

detecting a phase difference between a third clock and a fourth clock to output a second detect result; and detecting a phase difference between the first clock and the third clock to output a third detect result;

generating a plurality of digital codes corresponding to the first third detect results; and correcting the first to fourth clocks in response to the digital codes.

14. The phase correction method as recited in claim 13, wherein the detecting a phase difference between a first clock and a second clock includes:

detecting a rising edge of the first clock and a rising edge of the second clock;

activating a first edge detection signal and deactivating a second edge detection signal in response to the rising edge of the first clock, and deactivating the first edge detection signal and activating the second edge detection signal in response to the rising edge of the second clock; and comparing durations of the first and second edge detection signals respectively having the same logic level to output the first detect results.

15. The phase correction method as recited in claim 13, wherein the detecting a phase difference between a third clock and a fourth clock includes:

detecting a rising edge of the third clock and a rising edge of the fourth clock;

activating a third edge detection signal and deactivating a fourth edge detection signal in response to the rising edge of the third clock, and deactivating the third edge detection signal and activating the fourth edge detection signal in response to the rising edge of the fourth clock; and comparing durations of the third and fourth edge detection signals respectively having the same logic level to output the second detect result signals.

16. A clock phase correction method comprising:

receiving N pairs of clocks (where, N is a natural number larger than 1), and detecting a phase difference between one clock of each pair and the other clock of the pair; and selecting one clock in each pair and detecting a phase difference between the selected clocks;

generating a plurality of digital codes corresponding to the detected results; and correcting all of the clocks to be separated from each other by uniform phase differences in response to the plurality of digital codes.

17. The clock phase correction method as recited in claim 16, wherein the correcting N pairs of clocks includes:

detecting rising edges of two clocks of each pair;

generating two signals activating in the opposite direction in response to the rising edges of the two clocks of each pair; and comparing first logic level sections of the two signals.

* * * * *